(12) United States Patent
Shimizu et al.

(10) Patent No.: US 7,518,882 B2
(45) Date of Patent: Apr. 14, 2009

(54) CIRCUIT MODULE

(75) Inventors: Toshiki Shimizu, Yokkaichi (JP);
Kouichi Takagi, Yokkaichi (JP);
Fumiaki Mizuno, Yokkaichi (JP)

(73) Assignees: Autonetworks Technologies, Ltd., Mie (JP); Sumitomo Wiring Systems, Ltd., Mie (JP)

( * ) Notice: Subject to any disclaimer, the term of this patent is extended or adjusted under 35 U.S.C. 154(b) by 345 days.

(21) Appl. No.: 10/585,573

(22) PCT Filed: Feb. 4, 2005

(86) PCT No.: PCT/JP2005/001672

§ 371 (c)(1),
(2), (4) Date: Jul. 10, 2006

(87) PCT Pub. No.: WO2005/076676

PCT Pub. Date: Aug. 18, 2005

(65) Prior Publication Data

US 2008/0080151 A1 Apr. 3, 2008

(30) Foreign Application Priority Data

Feb. 6, 2004 (JP) ............................... 2004-030761

(51) Int. Cl.
*H01R 9/00* (2006.01)
(52) U.S. Cl. .................. 361/775; 361/772; 361/776; 361/760; 174/262; 174/263
(58) Field of Classification Search ............. 361/760, 361/775, 776, 777, 778, 779, 767, 772–774, 361/624, 627, 637, 640, 648; 174/262, 68.2, 174/70 B, 71 B, 72 B, 50, 59, 263, 261, 259, 174/265, 267
See application file for complete search history.

(56) References Cited

U.S. PATENT DOCUMENTS

| | | | |
|---|---|---|---|
| 4,907,991 A * | 3/1990 | Kobayashi | 439/876 |
| 6,370,032 B1 * | 4/2002 | DiStefano et al. | 361/760 |
| 6,372,998 B1 * | 4/2002 | Suzuki et al. | 174/260 |
| 2001/0026430 A1 * | 10/2001 | Onizuka et al. | 361/103 |

(Continued)

FOREIGN PATENT DOCUMENTS

JP    A 9-321395    12/1997

(Continued)

*Primary Examiner*—Dean A. Reichard
*Assistant Examiner*—Hoa C Nguyen
(74) *Attorney, Agent, or Firm*—Oliff & Berridge, PLC (57) ABSTRACT

In respect to an electrical connection between a control circuit board 20 and bus bars 14 interbonded together, it is an object to enhance stability in quality and reliability in connection. As a solution for achieving the object, the control circuit board 20 is provided with a conductor segment 26 to be electrically connected to a specific one of the bus bars 14 on the opposite side of a rear surface thereof bonded to the bus bars 14, and a through-hole 24 penetrating a main body thereof at a position adjacent to the conductor segment 26 so as to expose the specific bus bar 14 therethrough. Further, an electrically-connecting member 70 is disposed to bridge over the through-hole 24 and the conductor segment 26, and soldered onto the conductor segment 26 and the bus bar portion located in the through-hole 24.

7 Claims, 9 Drawing Sheets

U.S. PATENT DOCUMENTS

| | | | |
|---|---|---|---|
| 2002/0081905 A1* | 6/2002 | Nakamura et al. | 439/621 |
| 2002/0112883 A1* | 8/2002 | Baechtle et al. | 174/262 |
| 2003/0003800 A1* | 1/2003 | Chapman et al. | 439/571 |
| 2003/0137813 A1* | 7/2003 | Onizuka et al. | 361/777 |
| 2003/0168252 A1* | 9/2003 | Schmid et al. | 174/260 |
| 2004/0242086 A1* | 12/2004 | Takagi | 439/885 |

FOREIGN PATENT DOCUMENTS

| | | |
|---|---|---|
| JP | A 2003-164039 | 6/2003 |
| JP | A 2003-224918 | 8/2003 |

* cited by examiner

CIRCUIT MODULE

TECHNICAL FIELD

The present invention relates to a circuit module having a combination of a plurality of bus bars to form a power circuit to be mounted on an automobile or the like, and a control circuit board in which a control circuit for the power circuit is built.

BACKGROUND ART

Heretofore, as means for distributing electric power from a common vehicle-mounted power supply to respective electronic units, there has been widely known an electric junction box comprising a power distribution circuit formed by laminating a plurality of bus bar boards, and a circuit control element, such as a fuse and a relay switch, inserted in the power distribution circuit.

Late years, with a view to downsizing the distribution circuit unit, a circuit module as disclosed in the following Patent Publication 1 has been developed. This circuit module is designed such that a plurality of bus bars forming a power circuit are arranged approximately in the same plane and bonded on one of opposite surfaces of a control circuit board, which enable a reduction in thickness of the circuit module having a combination of the power circuit and a control circuit.

Patent Publication 1: Japanese Patent Laid-Open Publication No. 2003-164039

DISCLOSURE OF THE INVENTION

In the above circuit module, there is a need for electrical direct connection between a specific bus bar and the control circuit built in the control circuit board, in some cases. As measures for this need, the above Patent Publication 1 discloses a method for interconnection between the specific bus bar and the control circuit board by providing the control circuit board with a through-hole and supplying molten solder into the through-hole; however, in this connection structure, the solder is bonded to such a recessed portion in the through-hole that the quality of the soldering is hardly checked from outside through a visual or optical inspection. This disadvantage becomes prominent as a diameter of the through-hole is reduced to enhance board packaging density.

In view of the above circumstances, it is an object of the present invention to facilitate an inspection of an electrical interconnection between a control circuit board and a specific bus bar of a circuit module so as to enhance reliability of the electrical connection. Specifically, the present invention provides a circuit module including a plurality of bus bars arranged approximately in a same plane to form a power circuit, and a control circuit board in which a control circuit for controlling electrical continuity of the power circuit is built, wherein the bus bars are bonded to the control circuit board. The control circuit board is provided with a conductor segment to be electrically connected to at least a specific one of the bus bars on one surface of the control circuit board on the opposite side of the other surface bonded to the bus bars; and a through-hole penetrating a main body of the control circuit board at a position adjacent to the conductor segment so as to expose a portion of the specific bus bar through the through-hole. Further, the circuit module comprises an electrically-connecting member formed in a shape bridging between the through-hole and the conductor segment, and soldered onto both the conductor segment and the exposed portion of the specific bus bar.

In this circuit module, the specific bus bar and the conductor segment of the control circuit board are electrically interconnected through the electrically-connecting member, and the electrically-connecting member is exposed outside the control circuit board in a portion soldered onto the conductor segment of the control circuit board and in a portion soldered onto the specific bus bar. This makes it possible to check the soldered regions readily and accurately from outside through a visual or optical inspection.

Preferably, the electrically-connecting member is, for example, formed of a metal plate, and disposed in a posture approximately parallel to the control circuit board. This structure allows a solder fillet to be formed on the electrically-connecting member in a more stable state to enhance reliability of the electrical connection and reduces a protrusion of the electrically-connecting member from the control circuit board to contribute to reduction in thickness of the entire circuit module.

In this case, the above electrically-connecting member may have a surface soldered onto the conductor segment and a surface soldered onto the exposed portion of the specific bus bar. and be formed with a step portion providing a height difference approximately equal to a board thickness of the control circuit board between the surfaces. The height difference makes it possible to solder the electrically-connecting member onto the conductor segment and the specific bus bar with little forced deformation of the electrically-connecting member to drastically reduce a stress induced after the soldering.

The electrically-connecting member is preferably formed with a cutout in at least one of the portion soldered onto the conductor segment and the portion soldered onto the exposed portion of the specific bus bar. Such a cutout allows a larger amount of solder to be raised toward the electrically-connecting member through the cutout to facilitate checking the quality of soldering.

In the present invention, each of the conductor portions and the through-holes is not limited to a specific number. For example, the control circuit board may be provided with a plurality of the through-holes adjacent to the conductor segment, wherein the electrically-connecting member of a shape bridging over the through-holes and the conductor segment is soldered onto the conductor segment and a specific one or more of the bus bars exposed through the through-holes. This structure makes it possible to connect the electrically-connecting member to a plurality of portions in one bus bar so as to enhance reliability of the electrical connection, or to connect the electrically-connecting member to a plurality of bus bars respectively so as to give the electrically-connecting member a jumper function (a function of bridging between the bus bars spaced apart from each other).

In this case, the through-holes may be provided on both sides of and across the conductor segment, and the electrically-connecting member may be of a plate shape which bridges over the through-holes and the conductor segment, and have an intermediate portion soldered onto the conductor segment and opposite end portions each soldered onto a corresponding one or more of the exposed portions of the specific bus bars. This structure enables electrical connection of the common conductor segment to the bus bar portions exposed

BEST MODE FOR CARRYING OUT THE INVENTION

A preferred embodiment of the present invention will be described based on the drawings. The basic constitution of a circuit module and a production process therefor according to this embodiment are equivalent to those disclosed in the aforementioned Patent Publication 1. Thus, the basic configuration will be described only about an outline thereof.

Firstly, there is described one example of a production process for a circuit module. However, a circuit module according to the present invention is not limited to a product produced by the following process.

(1) Bus Bar Forming Process

Figure 1:
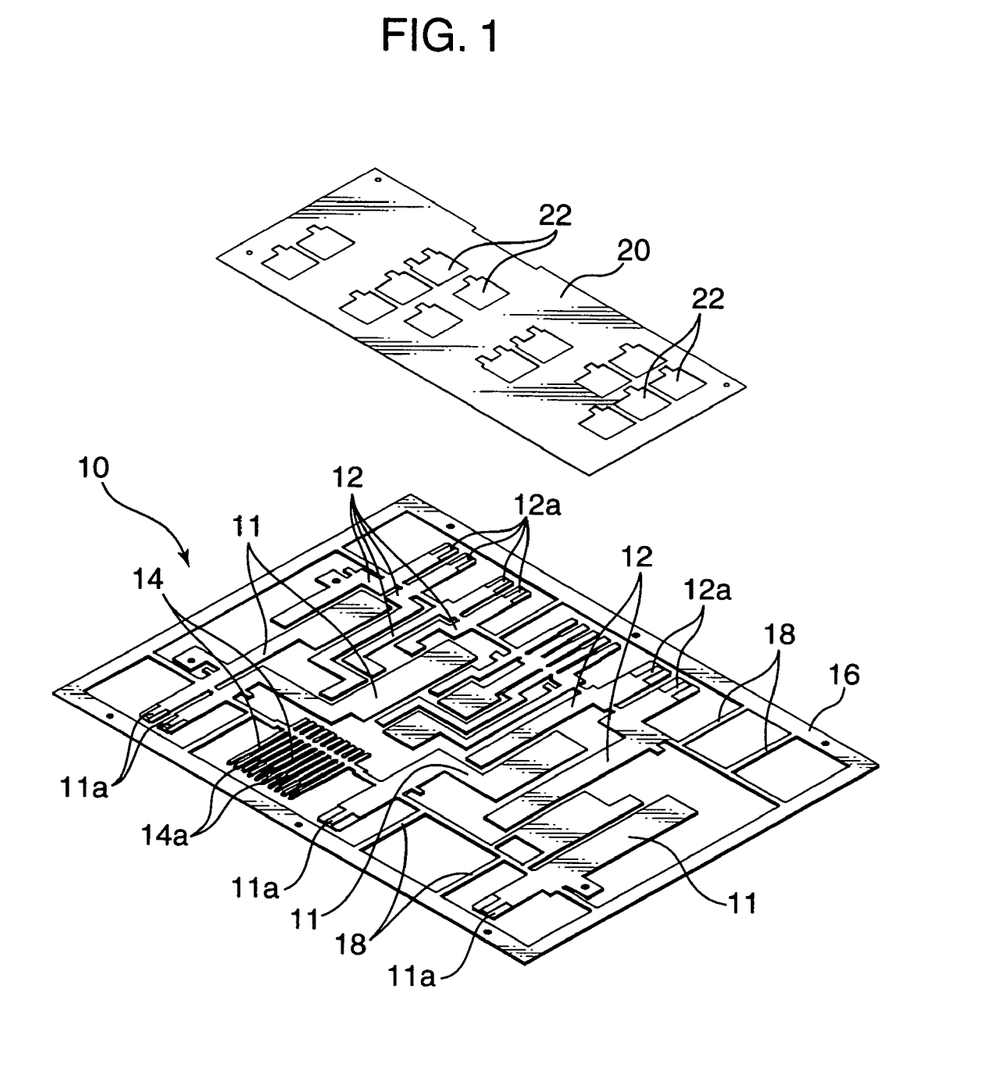
FIG. 1 is a perspective view showing a bus bar plate element and a control circuit board which are used for producing a circuit module according to an embodiment of the present invention.

For producing the circuit module, there is formed a bus bar plate element 10 as shown in FIG. 1.

The illustrated bus bar plate element 10 comprises a rectangular-shaped outer frame 16, inside which a large number of bus bars including a plurality of input-terminal bus bars 11 each adapted to form an input terminal, a plurality of output-terminal bus bars 12 each adapted to form an output terminal, and a plurality of signal-input-terminal bus bars 14 are arranged in a given pattern. Appropriate ones of the bus bars are connected to the outer frame 16 through a plurality of narrow linking segments 18, and specific ones of the bus bars are connected to each other through the narrow linking segments 18.

This bus bar plate element 10 can be readily formed, for example, by punching a single metal plate through press working.

(2) Bonding Process

Figure 2:
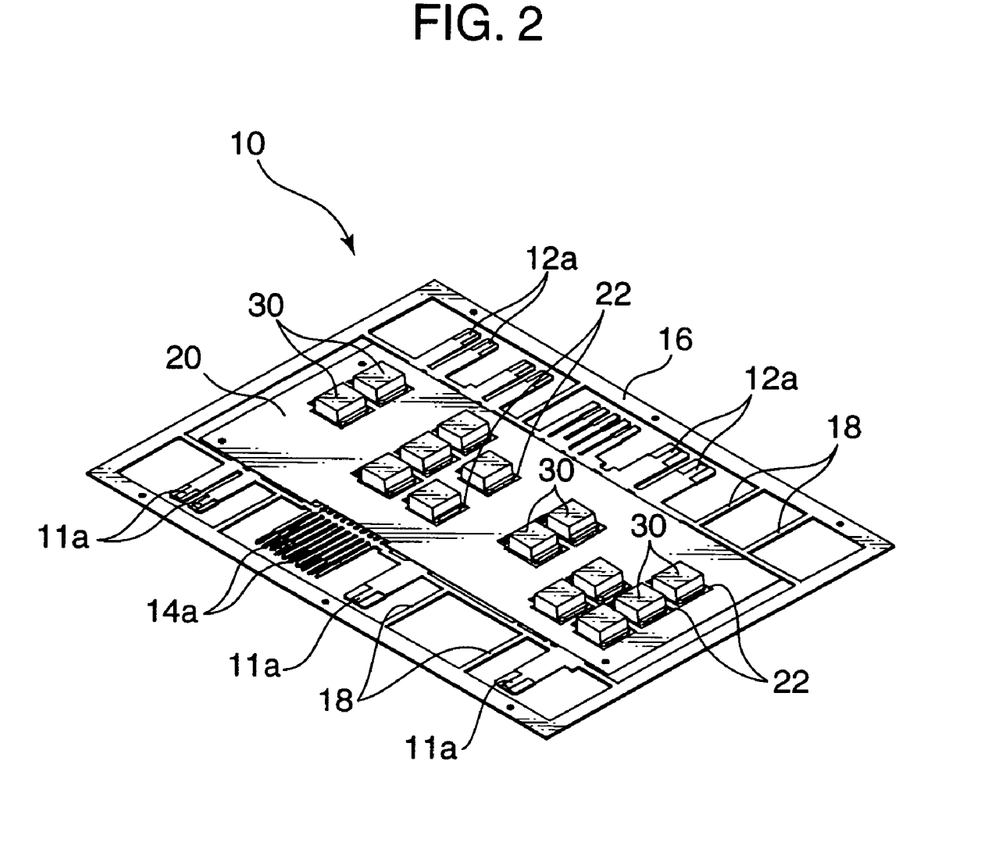
FIG. 2 is a perspective view showing a state in which the bus bar plate element and the control circuit board in FIG. 1 are bonded together.

A control circuit board 20 is bonded onto one side (upper side in FIG. 1) of opposite surfaces of the bus bar plate element 10 to arrive at a state illustrated in FIG. 2. The control circuit board 20 includes a control circuit for controlling electrical continuity of a power circuit formed of the bus bars. The control circuit board 20 may be composed of a conventional type of printed-circuit board (a board comprising an insulating board and a conductive pattern arranged thereon by printed wiring to form the control circuit), for example. In the illustrated embodiment, for further total reduction in thickness and further improvement in waterproof performance of the circuit module, used is the control circuit board 20 in a sheet-like shape having an extremely small thickness (e.g. 0.3 mm). The control circuit board 20 is provided with a plurality of through-holes 22 at appropriate positions. These through-holes 22 are used for mounting a plurality of switching elements 30 on the bus bars. In the illustrated embodiment, the control circuit board 20 has an outside dimension less than that of the bus bar plate element 10. Thus, a central region of the bus bar plate element 10 and the control circuit board 20 being interbonded together, respective end portions 11a of the input-terminal bus bars 11 and respective end portions 14a of the signal-input-terminal bus bars 14 protrude outward beyond a left edge of the control circuit board 20 and respective end portions 12a of the output-terminal bus bars 12 protrude outward beyond a right edge of the control circuit board 20, with all of the linking segments 18 exposed outside the control circuit board 20 (see FIG. 2).

(3) Mounting Process

The switching elements 30 as shown in FIG. 2 are mounted to both the control circuit board 20 and the bus bar plate element 10 through the use of the through-holes 22 formed in the control circuit board 20. These switching elements 30 are operable to turn on/off the electrical continuity of the power circuit formed of the bus bars. Specifically, a semiconductor element including a transistor or a mechanical relay device may be used as the switching elements 30.

This mounting process can be readily performed, for example, by applying molten solder into each of the through-holes 22 through a screen printing process or the like and setting the switching elements 30 on the molten solder.

(4) Electrically Connecting Process Some of the bus bars included in the bus bar plate element 10 are required to be connected directly to the control circuit of the control circuit board 20 (that is, to be connected to the control circuit without interposing the switching element 30 therebetween). This direct connection is performed in concurrence with the above mounting process. A specific structure and process for the direct connection will be described in detail later.

(5) Connector Forming Process

Figure 3:
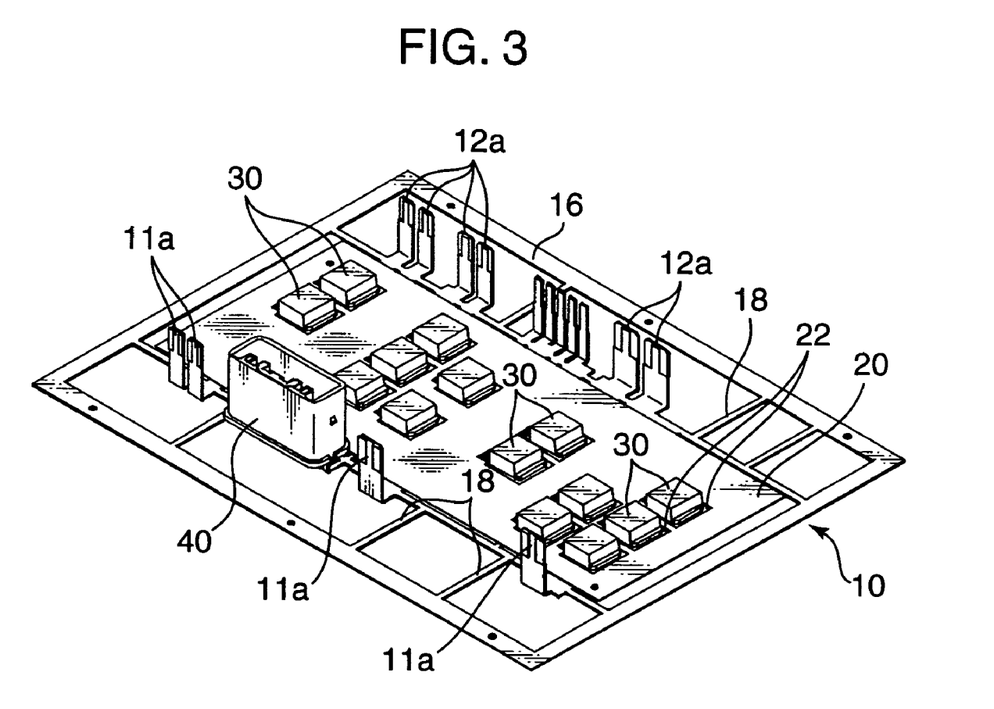
FIG. 3 is a perspective view showing a state in which a plurality of switching elements is mounted on the bus bar plate element and the control circuit board.

The bus bar end portions protruding outward beyond the right and left edges of the control circuit board 20 (including at least the end portions 11a, 12a, and 14a of the bus bars 11, 12, and 14 in FIGS. 1 and 2) are bent upward as shown in FIG. 3 to form a plurality of terminals to be connected to corresponding external circuits. These terminals include a plurality of signal input terminals (the end portions 14a of the signal-input-terminal bus bars 14 arranged in a row in FIG. 3), around which an insulating housing 40 as shown in FIG. 3 is fixed to form a connector.

(6) Cutting Off Process

Figure 4:
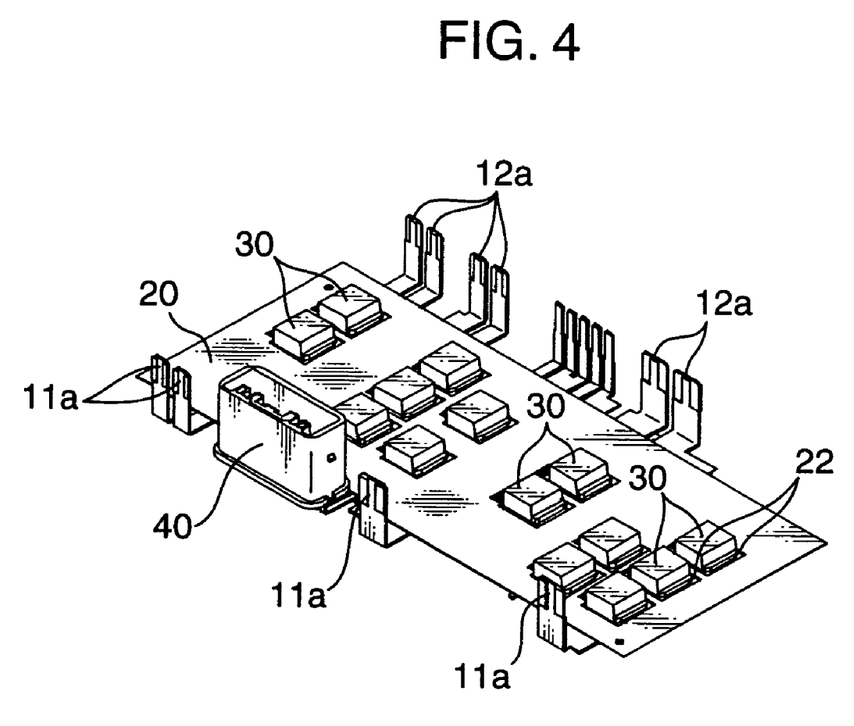
FIG. 4 is a perspective view showing a state in which respective end portions of given bus bars in the bus bar plate element are bent to form connectors.

The bus bars in the bus bar plate element 10 are cut off from each other through press working or the like to complete the power circuit. Specifically, this process can be performed by cutting and removing the linking segments 18 exposed outside the control circuit board 20. The removals of the linking segments 18 automatically result in removal of the outer frame 16 from the circuit module (see FIG. 4).

(7) Case Attaching Process

Figure 5:
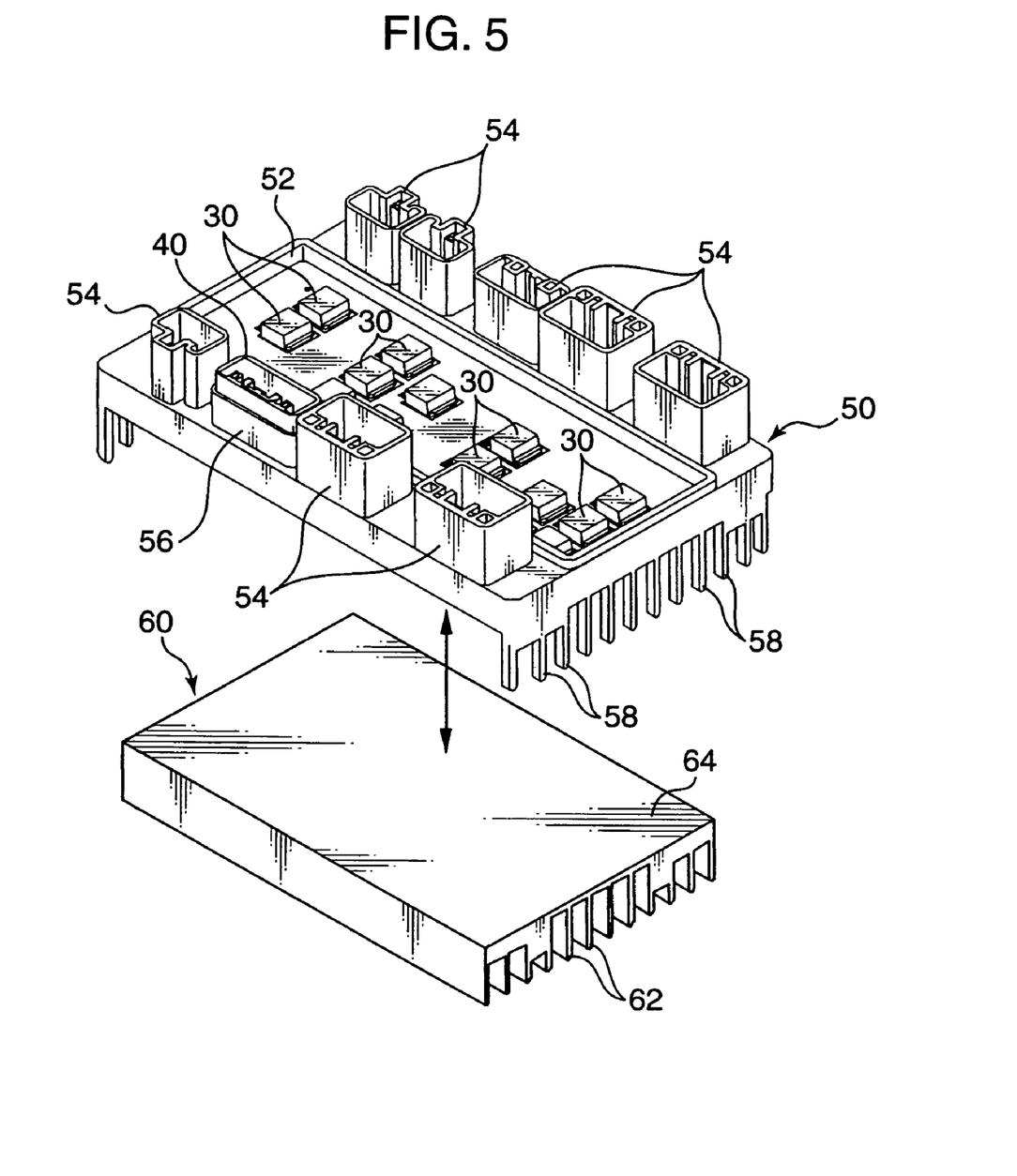
FIG. 5 is a perspective view showing a process of attaching a case to the bus bar plate element and the control circuit board.

A case 50 as shown in FIG. 5 is put over the circuit module obtained in the isolating process (6) from above. This case 50 has an open-bottomed shape to cover the entire control circuit board 20 from above, and is provided with an opening for exposing the switching elements 30 upward in a center portion, a waterproof wall 52 extending upward from a peripheral edge of the opening. The case 50 is integrally formed with a plurality of tubular-shaped housings 54 each having top and bottom openings, and a housing attached portion 56 into which the housing 40 is fittingly inserted, in right and left edge portions (the portions at the right side and left side of the waterproof wall 52). Then, the terminals and the corresponding housings 40, 54 make up connectors, which are coupled to other connectors, for example, attached to a end of a wire harness installed in a vehicle to enable easy interconnection of the terminals and an intended external circuit.

The case 50 has front and rear edge portions from which a plurality of fin covers 58 arranged in right-left direction protrude downwardly.

(8) Heat-Dissipation-Member Connecting Process

Bottom surfaces of the respective bus bars are bonded to a top surface 64 of a heat-dissipation member 60 as shown in FIG. 5 via an adhesive or an adhesive sheet. The heat-dissipation member 60 is generally made of a material excellent in heat conductivity such as aluminum-based metal. The top surface 64 is formed as a flat bonding surface while a plurality of fins 62 arranged in right-left direction protrude downwardly from a bottom surface of the heat-dissipation member 60. Positions of the respective fins 62 correspond to those of the finger covers 58, so that opposite longitudinal ends of the respective fins 62 are covered with the corresponding finger covers 58 when the heat-dissipation member 60 is attached to the case 50.

After that, waterproofing is performed by forming a layer consisting of a gelled resin on an inner surface of the waterproof wall 52, or fixing a cover to the waterproof wall 52.

The circuit module produced through the above process, in which input terminals (the end portions 11a of the input-terminal bus bars 11) are connected to a power supply and output terminals (the end portions 12a of the output-terminal bus bars 12) are connected to electrical loads, establish a power distribution circuit for distributing electric power from the power supply to an appropriate one or more of the electrical loads, while the control circuit built in the control. circuit board 20 controls operations of the respective switching elements interposed in the power distribution circuit to perform on-off control of the electrical continuity of the power distribution circuit.

The following description will be made about "(4) Electrically-Connecting Process", specifically, about a structure and process for direct connection between the specific bus bar and the control circuit board 20 (electrical connection without interposing the switching element 30).

(4-1) Control Circuit Board 20

Figure 6A:
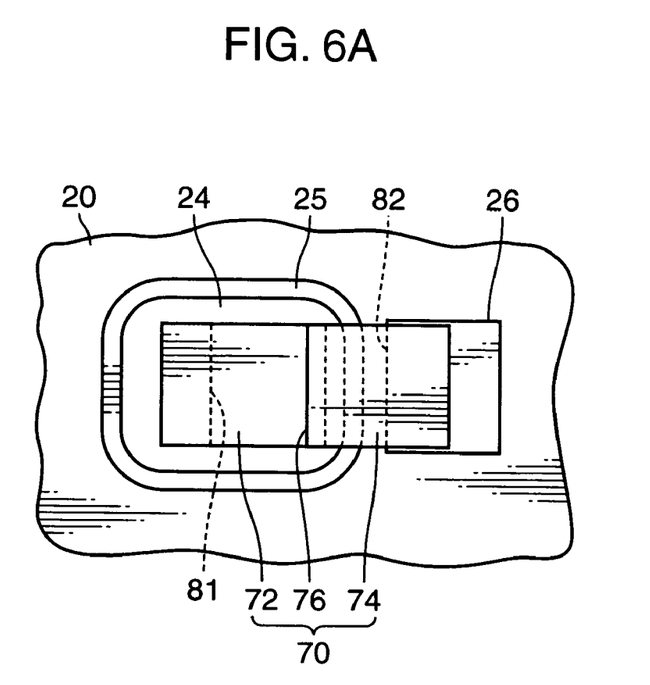
FIGS. 6A and 6B are, respectively, a top plan view and a sectional view showing a state in which a connecting chip is set to bridge over a through-hole and a conductor pad of the control circuit board.
Figure 6B:
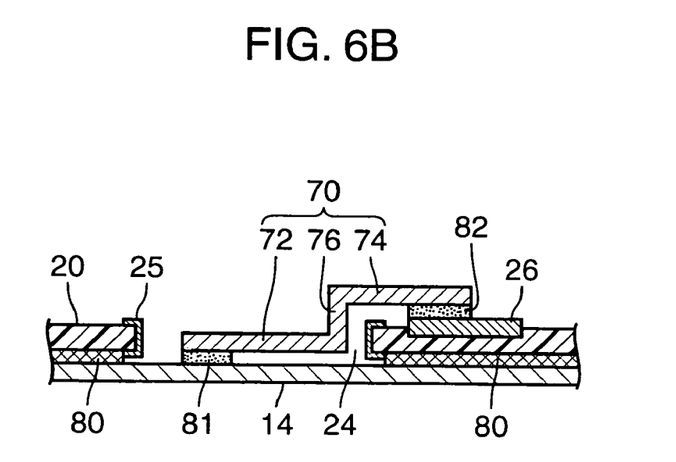

The control circuit board 20 is previously provided with a through-hole 24 and a conductive pad (conductor segment) 26 as shown in FIGS. 6A and 6B in place.

The conductive pad 26, which may be formed through a printing process in the same manner that the conductive pattern is formed, is connected to the control circuit formed of the conductive pattern. In the illustrated embodiment, the conductive pad 26 of an approximately rectangular shape in top plan view is provided on a front surface of the control circuit board 20, that is, on a surface of the opposite side of the surface bonded to the bus bar 14 in the control circuit board 20.

The through-hole 24, formed at a position adjacent to the conductive pad 26 so as to penetrate a main body of the control circuit board 20 in a direction of the board-thickness, serves for exposing a specific bus bar bonded to a rear surface (bottom surface in FIG. 6A) of the control circuit board 20, i.e. a bus bar to be electrically connected to the conductive pad 26 (the bus bar 14 in the illustrated embodiment), on the side of the front surface of the control circuit board 20 (upward in FIG. 6A and 6B). In the illustrated embodiment, provided is the through-hole 24 of an approximately rectangular shape, around which a metal frame 25 is formed.

(4-2) Connection Through the Medium of Connecting Chip

There are formed solid-phase solder layers 81, 82 on a top-surface of the bus bar 14 exposed on the side of the front surface of the control circuit board 20 through the through-hole 24, and a top surface of the conductive pad 26, respectively. Then, a connecting chip 70 as an electrically-connecting member is placed on the solid-phase solder layers 81, 82.

This connecting chip 70 serves as a connection medium between the bus bar 14 and the conductive pad 26, formed of a thin-walled metal plate, in the illustrated embodiment, having a shape bridging over the through-hole 24 and the conductive pad 26. More specifically, the illustrated connecting chip 70 has a flat-shaped bus bar-side connection portion 72 to be placed on the solder layer 81 on the side of the bus bar 14, a board-side connection portion 74 to be placed on the solder layer 82 on the side of the conductive pad 26, and a step portion 76 interconnecting respective adjacent ends of the connection portions 72, 74 to each other. The step portion 76 provides a height difference approximately equal to a thickness of the control circuit board 20 (a height difference slightly greater than the board thickness, in the illustrated embodiment), between a bottom-surface of the bus bar-side connection portion 72 and a bottom-surface of the board-side connection portion 74.

Figure 7A:
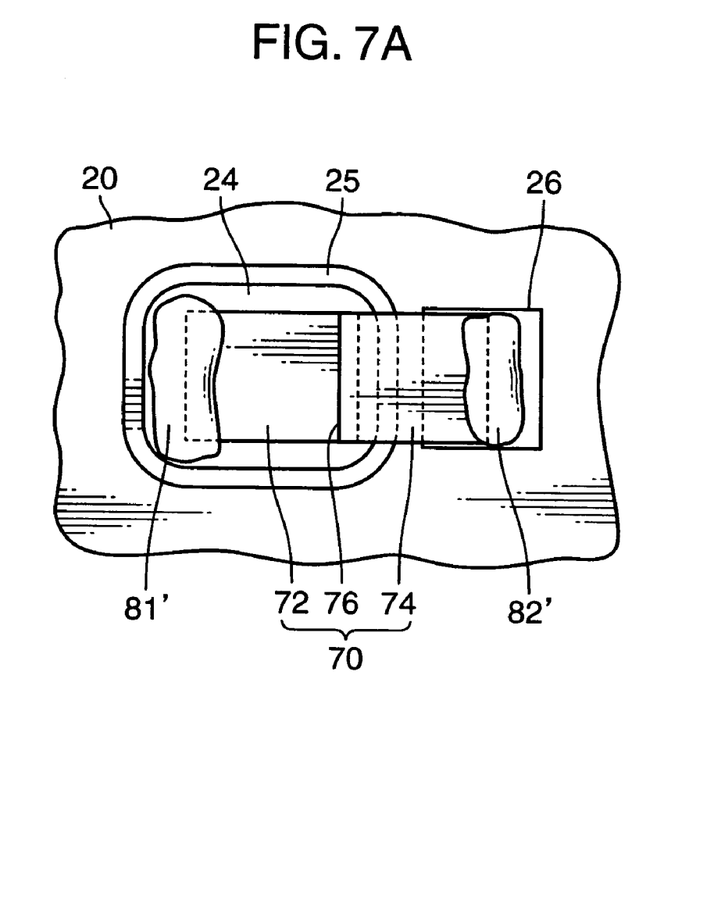
FIGS. 7A and 7B are, respectively, a top plan view and a sectional view showing a state in which a solder layer in FIGS. 6A and 6B has been heated and molted to form a solder fillet.
Figure 7B:
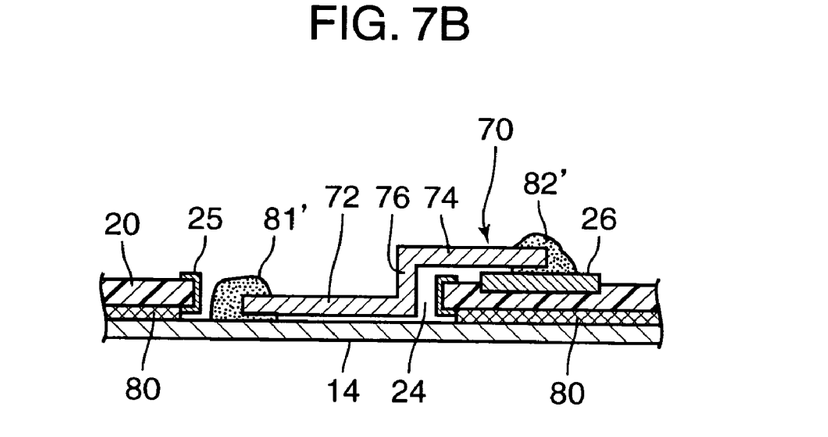

After placing the connecting chip 70, the solder layers 81, 82 are heated and molten to form solder fillets 81', 82' as shown in FIGS. 7A and 7B, through the medium of which the bus bar-side connection portion 72 and the board-side connection portion 74 are connected to the bus bar 14 and the conductive pad 26, respectively. That is, the bus bar 14 and the conductive pad 26 are electrically interconnected through the connecting chip 70.

According to the above structure and process, the resulting solder fillets 81', 82' are opened toward the front side of the control circuit board 20, which makes it possible to check the quality of the soldering from outside through a visual or optical inspection readily and accurately to ensure stable quality and enhanced reliability in the electrical connection.

While FIGS. 6A and 6B and FIGS. 7A and 7B show the example where a single through-hole 24 is formed correspondingly to a single conductive pad 26, a plurality of through-holes 24 may be formed at positions adjacent to the conductive pad 26 to establish various types of direct connection structures. One example of such direct connection structures are shown in FIGS. 8A and 8B.

Figure 8A:
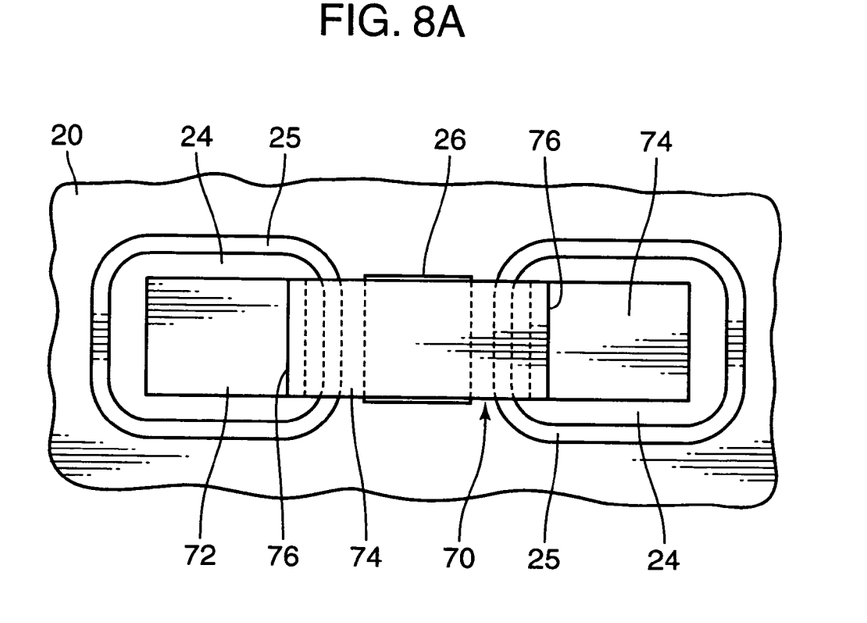
FIGS. 8A and 8B are, respectively, a top plan view and a sectional view showing a state in which another connecting chip is set to bridge over a plurality of through-holes and a conductor pad of a control circuit board.
Figure 8B:
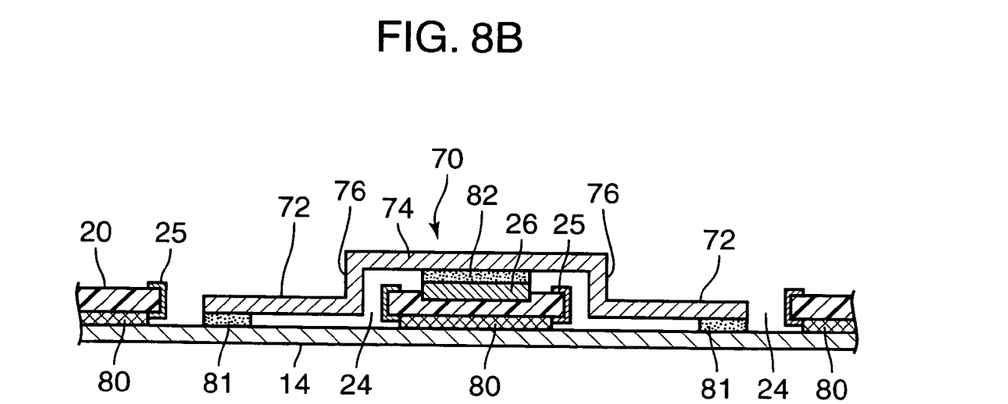

FIGS. 8A and 8B shows a circuit board 20 provided with through-holes 24 on both sides of and across a conductive pad 26, and such a relatively long connecting chip 70 as bridges the conductive pad 26 and the right and left through-holes 24 is set.

This connecting chip 70 has a flat plate-shaped board-side connection portion 74 at its central portion, two bus bar-side connection portions 72 at the right and left sides of the connection portion 74, and a pair of step portions 76 so formed as to vertically interconnect the opposite ends of the board-side connection portion 74 and the respective bus bar-side connection portions 72. Each of the step portions 76 also provides a height difference approximately equal to a thickness of the control circuit board 20 as described in the above embodiment.

On the other hand, on top-surface portions of the bus bar 14 exposed through the through-holes 24 and a top surface of the conductive pad 26 are formed three solder layers 81, 82, respectively, on which the bus bar-side connection portions 72 and the board-side connection portion 74 of the connecting chip 70 are set, respectively. Then, the solder layers 81, 82 are heated and molted to form solder fillets which interconnect the respective bus bar-side connection portions 72 and the bus bars 14, and solder fillet which interconnects the board-side connection portion 74 and the conductive pad 26.

In the resulting connection structure, the number of connections between the connecting chip 70 and the bus bar 14 is two (it may be three or more), which enhances reliability of the electrical connection. Otherwise, the plurality of bus bar-side connection portions 72 may be connected, respectively, to the two or more different bus bars respectively, which can give the connecting chip 70 a jumper function (function of bridging between the bus bars spaced apart from each other).

Figure 9A:
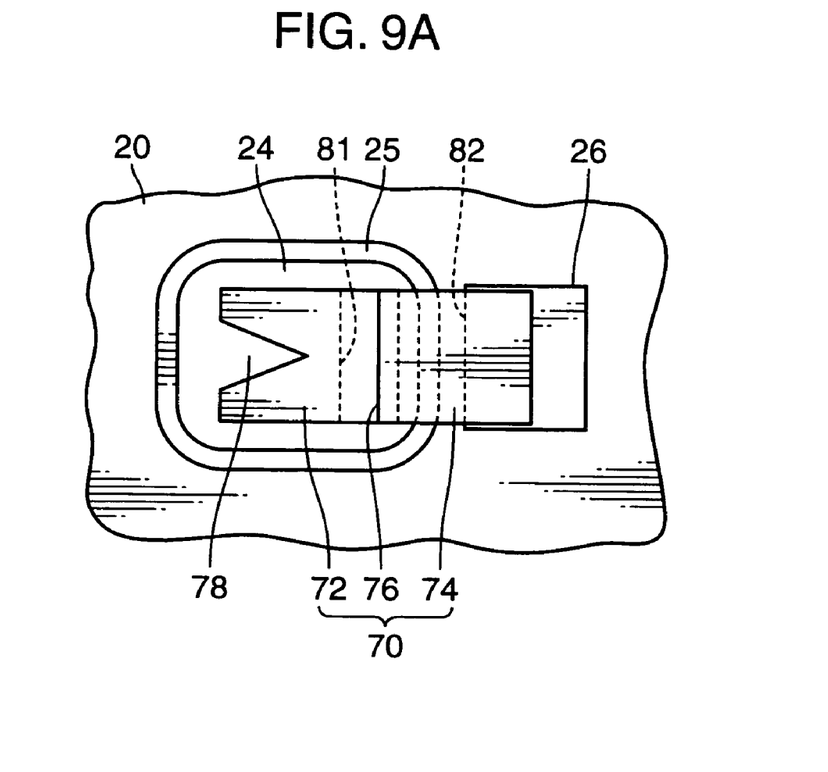
FIGS. 9A and 9B are, respectively, a top plan view and a sectional view showing a state in which still another connecting chip formed with a cutout in a bus bar-side connection portion is set to bridge over a through-hole and a conductor pad of a control circuit board.
Figure 9B:
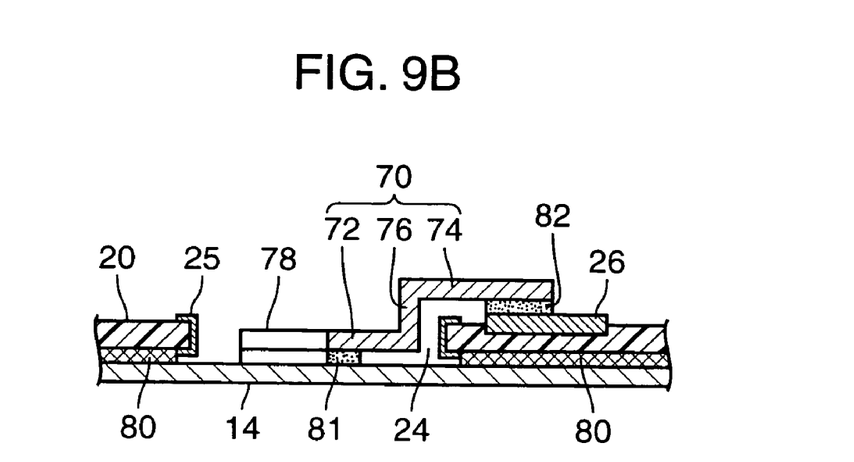

The bus bar-side connection portion 72 and/or the board-side connection portion 74 may be formed with a cutout to allow molten solder to be raised through the cutout. This increases a solder-fillet formation area to facilitate checking the solder fillet more. For example, as shown in FIG. 9A, a cutout, namely notch 78, may be formed in an end of the bus bar-side connection portion 72, which allows a solder fillet to be raised from a peripheral edge of the notch 78 toward a top surface of the bus bar-side connection portion 72, thus increasing the solder-fillet formation area as compared with the structure illustrated in FIGS. 7A and 7B.

The present invention may be implemented, for example, in the following form.

In the present invention, the electrically-connecting member is not limited to a specific shape, e.g. a plate-like shape, but may have a block-like shape. However, as described in the above illustrated embodiment, the connecting chip 70 formed in a plate-like shape and disposed in a posture approximately parallel to the control circuit board 20 allows a solder fillet to be more stably formed on the connecting chip 70 to ensure enhanced reliability of the electrical connection.

Even an electrically-connecting member without the height difference provided by the step portion 76 (e.g. a metal plate of a simple flat-plate shape) may interconnect the bus bar and the conductor segment (the bus bar 14 and the conductive pad 26, in the above illustrated embodiment) on the condition that the control circuit board 20 has an extremely small thickness or the electrically-connecting member is made of a high elastic material.

The through-hole 24 and the conductive pad 26 is not limited to a specific shape, and any suitable shape may be appropriately selected on condition that the electrically-connecting member can be soldered. Further, in cases where the circuit module has a plurality of electrical interconnections between the control circuit board and the bus bar(s), not every electrical interconnection must use the above electrically-connecting member; at least one of the interconnections may use the aforementioned direct connection structure comprising a combination of the through-hole(s), the conductor segment and the electrically-connecting member.

What is claimed is:

1. A circuit module comprising;
   a plurality of bus bars arranged approximately in a same plane to form a power circuit;
   a control circuit board in which a control circuit for controlling electrical continuity of the power circuit is built, being bonded to said bus bars, and provided with a conductor segment to be electrically connected to at least a specific one of said bus bars on one surface of said control circuit board on the opposite side of the other surface bonded to said bus bars, and a through-hole penetrating a main body of the control circuit board at a position adjacent to said conductor segment so as to expose a portion of said specific bus bar; and
   an electrically-connecting member of a shape bridging between said through-hole and said conductor segment, said electrically-connecting member being soldered onto both said conductor segment and the exposed portion of said specific bus bar,
   wherein said electrically-connecting member is formed of a metal plate and disposed in a posture approximately parallel to said control circuit board, and
   wherein said electrically-connecting member has a surface soldered onto said conductor segment and a surface soldered onto the exposed portion of said specific bus bar, and is formed with a step portion providing a height difference approximately equal to a board thickness of said control circuit board, between the surfaces, the height difference allowing a solder fillet connecting the electrically-connecting member to the bus bar to be formed on a surface of the exposed portion of said specific bus bar.

2. The circuit module as defined in claim 1, wherein said electrically-connecting member is formed with a cutout in at least one of the portion soldered onto said conductor segment and the portion soldered onto the exposed portion of said specific bus bar.

3. The circuit module as defined in claim 1, wherein said control circuit board is provided with a plurality of said through-holes adjacent to said conductor segment, and said electrically-connecting member formed in a shape bridging over said through-holes and said conductor segment is soldered onto said conductor segment and a specific one or more of said bus bars exposed through said through-holes.

4. The circuit module as defined in claim 3, wherein said through-holes are formed at the both sides of and across said conductor segment, while said electrically-connecting member is formed in a plate shape bridging over said through-holes and said conductor segment and has an intermediate portion soldered onto said conductor segment and opposite end portions each soldered onto a corresponding one or more of the exposed portions of said specific one or more bus bars.

5. A circuit module comprising:
   a plurality of bus bars arranged approximately in a same plane to form a power circuit;
   a control circuit board in which a control circuit for controlling electrical continuity of the power circuit is built, being bonded to said bus bars, and provided with a conductor segment to be electrically connected to at least a specific one of said bus bars on one surface of said control circuit board on the opposite side of the other surface bonded to said bus bars, and a through-hole penetrating a main body of the control circuit board at a position adjacent to said conductor segment so as to expose a portion of said specific bus bar; and an electrically-connecting member of a shape bridging between said through-hole and said conductor segment, said electrically-connecting member being soldered onto both said conductor segment and the exposed portion of said specific bus bar;

wherein said electrically-connecting member is formed with a cutout in at least one of the portion soldered onto said conductor segment and the portion soldered onto the exposed portion of said specific bus bar.

6. A circuit module comprising:

a plurality of bus bars arranged approximately in a same plane to form a power circuit;

a control circuit board in which a control circuit for controlling electrical continuity of the power circuit is built, being bonded to said bus bars, and provided with a conductor segment to be electrically connected to at least a specific one of said bus bars on one surface of said control circuit board on the opposite side of the other surface bonded to said bus bars, and a through-hole penetrating a main body of the control circuit board at a position adjacent to said conductor segment so as to expose a portion of said specific bus bar; and an electrically-connecting member of a shape bridging between said through-hole and said conductor segment, said electrically-connecting member being soldered onto both said conductor segment and the exposed portion of said specific bus bar, wherein said control circuit board is provided with a plurality of said through-holes adjacent to said conductor segment, and said electrically-connecting member formed in a shape bridging over said through-holes and said conductor segment is soldered onto said conductor segment and a specific one or more of said bus bars exposed through said through holes.

7. The circuit module as defined in claim 6, wherein said through-holes are formed at the both sides of and across said conductor segment, while said electrically-connecting member is formed in a plate shape bridging over said through-holes and said conductor segment and has an intermediate portion soldered onto said conductor segment and opposite end portions each soldered onto a corresponding one or more of the exposed portions of said specific one or more bus bars.

* * * * *

UNITED STATES PATENT AND TRADEMARK OFFICE
CERTIFICATE OF CORRECTION

PATENT NO. : 7,518,882 B2
APPLICATION NO. : 10/585573
DATED : April 14, 2009
INVENTOR(S) : Toshiki Shimizu, Kouichi Takagi and Fumiaki Mizuno It is certified that error appears in the above-identified patent and that said Letters Patent is hereby corrected as shown below:

On the title page, item [73]:

Please replace the following paragraph:

(73) Assignees: Autonetworks Technologies, Ltd., Mie (JP)
                  Sumitomo Wiring Systems, Ltd., Mie (JP)

with (73) Assignees: Autonetworks Technologies, Ltd., Mie (JP)
                  Sumitomo Wiring Systems, Ltd., Mie (JP)
                  Sumitomo Electric Industries, Ltd., Osaka (JP)

Signed and Sealed this

Twenty-third Day of March, 2010

David J. Kappos
*Director of the United States Patent and Trademark Office*